United States Patent [19]

Ogami et al.

[11] Patent Number: 4,591,044

[45] Date of Patent: May 27, 1986

[54] APPARATUS FOR FEEDING WAFERS AND THE LIKE

[75] Inventors: Nobutoshi Ogami; Noritaki Mori, both of Hikone, Japan

[73] Assignee: Dainippon Screen Mfg. Co. Ltd., Kyoto, Japan

[21] Appl. No.: 696,020

[22] Filed: Jan. 29, 1985

[30] Foreign Application Priority Data

Feb. 13, 1984 [JP] Japan .................. 59-25823

[51] Int. Cl.⁴ .............................................. B23Q 7/00
[52] U.S. Cl. ............................ 198/346.3; 198/468.8; 198/631; 198/817
[58] Field of Search ................... 198/346, 346.3, 463.3, 198/468.8, 817, 339.1, 343, 586, 413, 414, 631, 345, 952; 414/222, 225, 416, 417

[56] References Cited

U.S. PATENT DOCUMENTS 3,052,339 9/1962 Carter .................... 198/463.3 X
4,217,977 8/1980 Tam ........................ 198/345 X
4,457,419 7/1984 Ogami et al. ................ 198/345

*Primary Examiner*—Robert J. Spar
*Assistant Examiner*—Jonathan D. Holmes

*Attorney, Agent, or Firm*—Brumbaugh, Graves, Donohue & Raymond

[57] ABSTRACT

An apparatus for feeding semiconductor substrates (i.e., wafers) or the like along a path to a processing section such as a hot plate, and moving the same therefrom to the next process. The apparatus includes: a belt conveyor means preferably comprised for a pair of belts and having a horizontal top surface which can be driven along the feed path; means for raising and lowering the belt conveyor means to allow the wafers to be placed into position and taken out of position on the processing section; a processing plate associated with the processing section having a suction tube through which a vacuum is applied to a wafer on the processing plate, and also having grooves to receive the belts when the wafer is placed on the processing plate; and elevator means, which cooperate with the belt conveyor means, for raising the wafer to detach from the plate. The elevator means protrudes and withdraws with respect to the upper surface of the processing plate, and may take several forms such as horizontal longitudinal members which are received by grooves in the processing plate, or pins projecting from the holes in the processing plate through which the pneumatic suction is applied to the wafers during the heat treatment provided by the hot plate.

7 Claims, 19 Drawing Figures

APPARATUS FOR FEEDING WAFERS AND THE LIKE

BACKGROUND OF THE INVENTION

The present invention relates to an apparatus for feeding semiconductor substrates (hereinafter referred to as wafers), or any other thin sheets or plates, such as printed circuit boards and printing plates, to a processing section, and moving the same therefrom to the next process. More particularly, the present invention relates to an apparatus for such use, wherein the apparatus is adapted for use in association with a heating medium, whereby the objects are heated and dried.

To feed wafers to a heat treating unit and transfer the same to the next step, there have been many proposals, among which are a pneumatic system (Japanese Patent Application Laid-Open No. 58-21332), a belt conveyor system (Japanese Utility Model Application Laid-Open No. 56-89251, Patent Application Laid-Open No. 58-223340, and Utility Model Application No. 57-97915), and a so called link-motion conveyor system (Japanese Patent Application Laid-Open No. 57-136336), which are discussed in detail below.

The pneumatic system, which transfers wafers by means of substantially upward air-blow, has a drawback that the wafers are apt to be stained with dirt flown by the air. In particular, when highly integrated circuits are included in the wafers, the problem of dirt becomes fatal to the quality control of the semiconductor products.

The belt conveyor system, which ordinarily uses a pair of conveyor belts to convey the wafers, employs air suction to hold the wafers on the finely finished surface of a hot plate. But, the wafers tend to adhere to the hot plate even after the suction is turned off because the wafers are also very smooth. Also, molten photoresist film which may protrude from the periphery of the wafer tends to stick to the hot plate. Each of these problems often causes the wafers to become dislocated from their required position on the conveyor belts.

To solve the problems of the belt conveyor system, it has been proposed that air be blown against the bottom surface of the wafers through the same pores or tubes used for suction purposes. However, this creates the dirt and dislocation problems previously mentioned.

The so-called link-motion or walking beam conveyor system has the advantage of positively lifting the wafers from the hot plate. However, the apparatus employed in these systems require a relatively large space in front and in back of the hot plate to allow the beam to move in its rectangular path. This disadvantage is especially troublesome for those factories of wafer manufacturers where sanitary conditions are strictly regulated, since it is desirable to minimize the size of the equipment as much as possible. Wafers of increased size, which are now in demand, make this problem even more troublesome. The foregoing problem makes the link-motion conveyor system objectionable.

The present invention is directed toward solving the aforementioned problems of conventional wafer conveyor systems. Specifically, it is a primary object of this invention to provide a system of feeding wafers for heat treatment, such that each wafer is lifted from the hot plate and thereafter immediately moved, so as to avoid possible dislocation of the wafer, and so as to secure smooth, trouble-free feeding of the wafers in an automatic sequence.

Another object of the present invention is to provide a system of feeding wafers for heat treatment in a minimum of space.

A further object of the present invention is to provide a wafer conveying system capable of securing operational safety and reliability.

Other objects and advantages of the present invention will become apparent from the detailed description hereinafter taken in conjunction with the accompanying drawings.

SUMMARY OF THE INVENTION

To achieve the foregoing objects, there is provided, in one embodiment of the present invention, an apparatus for feeding wafers or the like along a path to a processing section such as a heat treating section, and moving the same therefrom to the next process. This apparatus comprises: a belt conveyor means drivable along a feed path and having a top surface that is horizontally maintained; means for raising and lowering the belt conveyor means, thereby allowing the wafer on the belt conveyor means to come into or out of position on the processing section; at least one processing plate associated with the processing section to which at least one suction tube is connected; and elevator means, substantially cooperating with said belt conveyor means, for raising the wafer or the like to detach said wafer from the processing plate. The suction tube is arranged to allow a vacuum to pass therethrough to hold the wafer on the processing plate. A groove is provided on the upper surface of the processing plate to receive the belt conveyor means when the wafer or the like is placed on the processing plate. The elevator means is arranged such that it protrudes and withdraws with respect to the upper surface of the processing plate.

DETAILED DESCRIPTION

THE CONVENTIONAL SYSTEMS

Figure 1:
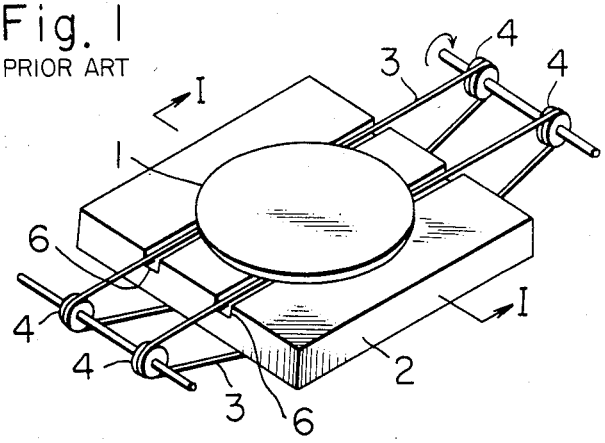
FIG. 1 is a perspective view showing a conventional belt conveyor system.
Figure 2:
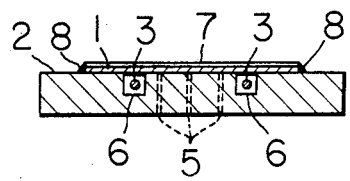
FIG. 2 is a cross-sectional view taken along the line I—I in FIG. 1.
Figure 3:
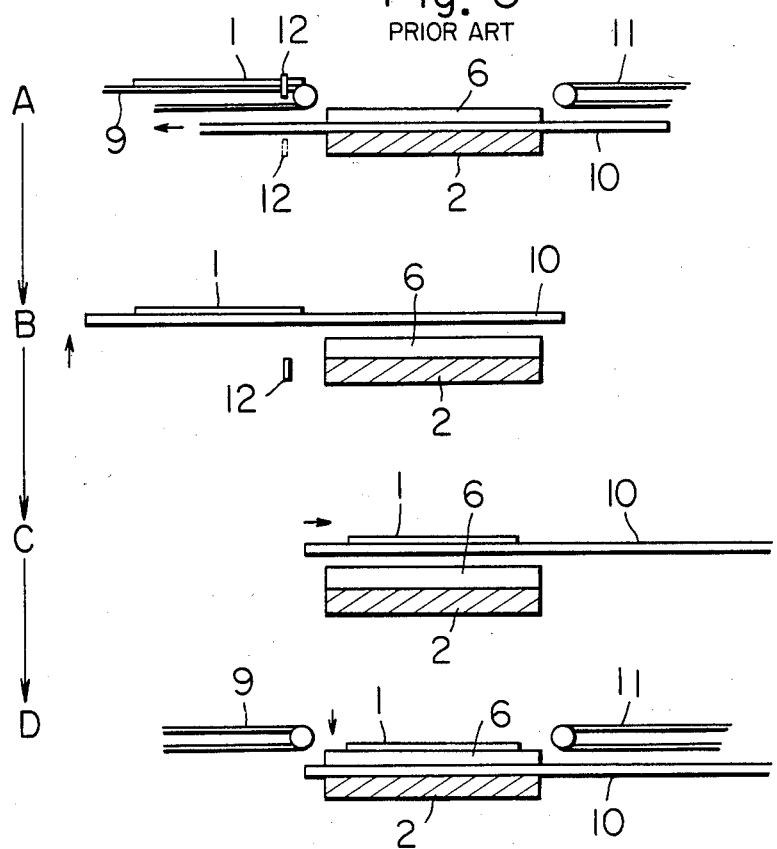
FIGS. 3A through 3D are diagrammatical views of a conventional walking-beam conveyor system.

Before describing illustrative embodiments of the present invention, the drawbacks associated with the two conventional wafer conveyor systems briefly described above will be more fully described through reference to FIGS. 1 through 3, which illustrate these two systems.

A conventional belt conveyor system, as illustrated in FIGS. 1 and 2, attracts a wafer 1 to a hot plate 2 by negative air pressure provided through suction tubes 5 while the wafer 1 is heated. After the heat treatment is finished, the suction applied to the wafer 1 is released, thereby allowing the wafer 1 to be removed from the hot plate 2. However, the wafer 1 adhesively remains on the hot plate 2 because of the sticking tendency caused by finely finished surfaces of the wafer and the hot plate. As a result, when the lifting unit, comprised of pair of belts 3 and pulleys 4, is raised, the wafer 1 is forceably lifted, which often results in the dislocation of the wafer 1 from its required position on the belts 3. The dislocation of the wafer 1 is amplified by the elasticity of the belts 3. The wafer 1 often falls off the belts 3 and is damaged.

In FIG. 2, reference numeral 8 denotes molten photoresist protruding from the periphery of the wafer 1, and reference numeral 7 denotes photoresist film 7 thinly formed on the wafer 1. The protruding photoresist 8 tends to stick to or deposit on the hot plate 2 when the wafer 1 is heated. This often causes the wafer 1 to adhere to the hot plate 2 even as the belts 3 try to lift the wafer. Under such circumstances, the belts can slide against the wafer, causing damage to the wafer surfaces. In spite of the foregoing, the wafer may remain stationary on the hot plate. In the automatic equipment, such problems obstruct the flow of sequential operations.

The previously mentioned proposal to solve the problems of the belt conveyor system involves blowing air against the bottom surface of the wafer 1 through the tubes 5 to raise it from the hot plate. As explained above, this would create other problems with dirt and dislocation.

The so-called link-motion conveyor system, illustrated in FIGS. 3A through 3D, has an advantage of positively lifting wafer 1 above a hot plate 2. The hot plate 2 has a pair of grooves 6 in which a pair of beams 10 are movably provided. The wafer 1, which is fed by a conveyor 9, comes into engagement with a pair of positioning pins 12, thereby positioning it at a predetermined position. At this stage the beams 10 are moved to the left in FIG. 3A, and then are raised so as to receive the wafer 1 thereon as shown in FIG. 3B. With the wafer 1 thereon, the beams 10 are moved to the right as shown in FIG. 3C, and are lowered as shown in FIG. 3D, leaving the wafer 1 on the hot plate 2. After the heat treatment is finished, the procedure is similarly repeated so as to take out the wafer 1. As can be seen in FIG. 3, a relatively large space is required in front of and in back of the hot plate 2 so as to allow the beams 10 to move in its circle. As previously explained, this is a significant disadvantage.

EMBODIMENTS OF THE INVENTION

The illustrative embodiments of the present invention will now be explained with reference to FIGS. 4 through 13.

Figure 4:
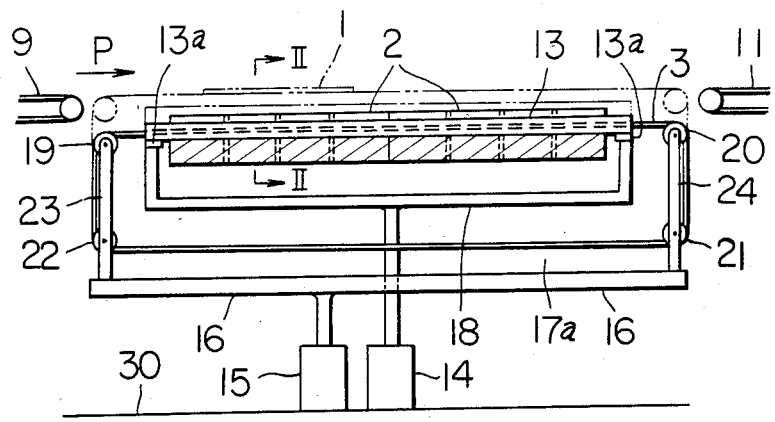
FIG. 4 is a side view in partial cross-section of a first embodiment of the present invention.
Figure 5:
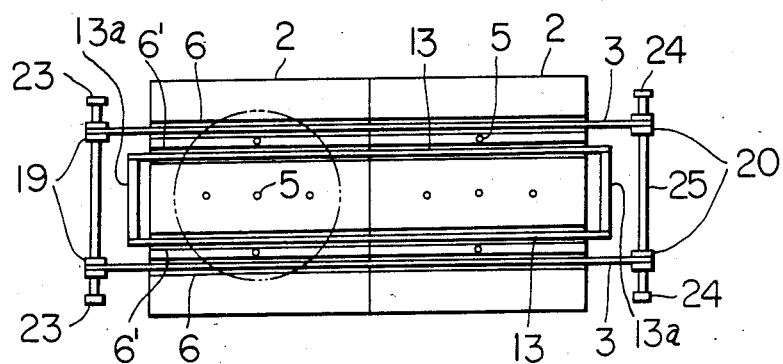
FIG. 5 is a plan view the embodiment of FIG. 4.
Figure 6:
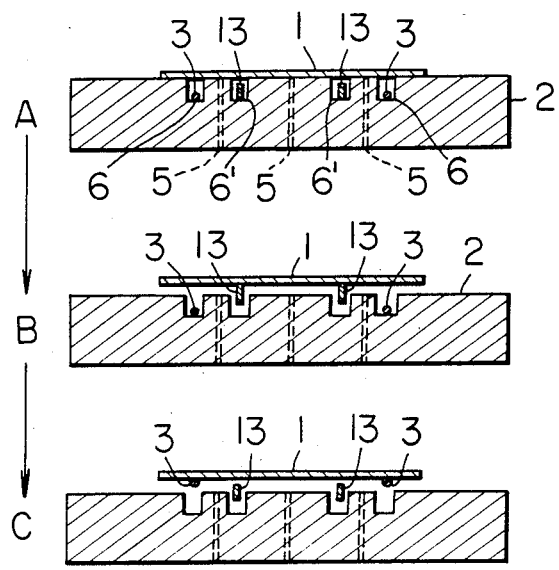
FIGS. 6A through 6C are schematic views exemplifying the sequence of operations of the first embodiment of the invention.

Referring to FIGS. 4 and 5, a hot plate 2 is provided on its top surface with two pairs of grooves 6 and 6', which extend along the direction of a feed path P. A pair of belts 3 are received in the grooves 6 such that the belts 3 can run therein and move up and down with respect thereto. There is also provided an elevator, comprised of a pair of longitudinal members 13 received by the grooves 6' and a pair of lateral members 13a, suitable for lifting the wafer 1 from the hot plate 2. The elevator is supported by a framework 18 which is connected with the lateral members 13a. The framework 18 is further connected to a pneumatic or hydraulic cylinder 14, which vertically moves the elevator in order to lift the wafer 1 from the hot plate 2.

The hot plate 2 is additionally provided with suction tubes 5 which at one end are each in communication with a suction pump (not shown) and on the other end are each in communication with the upper surface of the hot plate 3 so as to fixedly hold the wafer 1 thereon. In the embodiment illustrated in FIGS. 4 and 5, two hot plates 2 are located in series, so as to treat two wafers at the same time. It is possible to arrange the hot plates in parallel, or to use a single hot plate. Various modifications are possible.

Each belt 3 is looped such that it encircles the hot plate 2 as best shown in FIG. 4. The reference numerals 20 and 19 denote driving pulleys and followers, respectively. Tension pulleys are also provided. These pulleys and followers 19 through 22 are carried on pillars 23 and 24, which are supported by a framework 16, which may be moved up and down by a pneumatic or hydraulic cylinder 15. In this way the framework 16 bearing the belts 3 ascends and descends with respect to the hot plate 2 as shown by dotted lines in FIG. 4.

The driving pulleys 20 are connected to a motor (not shown) through a speed reduction means or system. While the belts 3 are driven the wafer 1 placed thereon is fed to the heat treating section, i.e., the hot plate 2. At this stage the framework 16 is lowered, thereby allowing the belts 3 to sink below the top surface of the hot plate 2. The wafer 1 is softly placed on the the hot plate 2.

The belts 3 can be moved up and down by using various devices. One example is disclosed in Japanese Patent Application Laid-Open (Kokai) No. 58-223340, in which the belts are pushed from above. Another example is disclosed in Japanese Utility Model Application Laid-Open (Kokai) No. 59-9544, in which the belts are slackened. These techniques can be effectively adopted for the present invention.

Instead of using the cylinders 14 and 15, a cam or cams may be employed to raise and lower the belts 3 and the pushers 13.

Referring to FIGS. 6A through 6C, the belts 3 are driven at the same speed as that of a conveyor 9, which is comprised of a pair of belts. The wafer 1 is transferred from the conveyor 9 onto the belts 3, and when the wafer 1 on the belts 3 comes to a predetermined position, the belts 3 are stopped. Then, the framework 16 is lowered by the cylinder 15, thereby allowing the belts 3 to sink in the grooves 6. The wafer 1 is softly placed on the hot plate 2 as shown in FIG. 6A, while the belts 3 are sinking into the grooves, and is subjected to the heat treatment.

After the heat treatment, the elevator is raised by the cylinder 14 and projects from the top surface of the hot plate 2. This causes the wafer 1 on the hot plate 2 to be raised off of the top surface of the hot plate 2, as shown in FIG. 6B. At this stage the belts 3 are raised by the cylinder 15 as the elevator is raised, until the belts 3 reach a slightly higher point than the elevator, thereby allowing the wafer 1, which was initially lifted by the elevator, to be held on the belts 3, as shown in FIG. 6C. Then, the belts 3 are again driven so as to convey the wafer 1 to a discharge conveyor 11. After the wafer is transferred to the discharge conveyor 11, the pushers 13 are caused to sink into the grooves 6'. The next wafer is transferred from the feeding conveyor 9 to the belts 3, and the same procedure is repeated.

Figure 7:
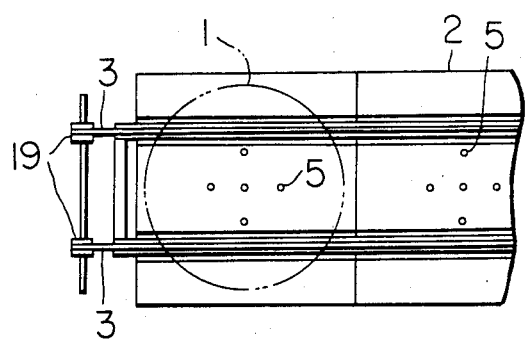
FIG. 7 is a partial plan view of a second embodiment of the invention.
Figure 8:
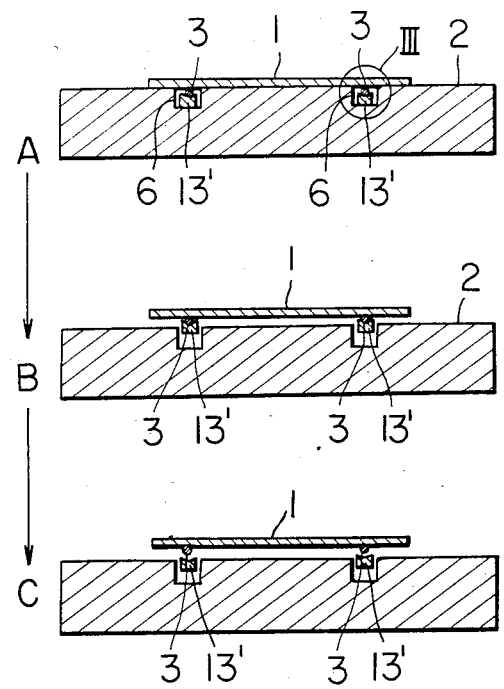
FIGS. 8A through 8C are schematic views exemplifying the sequence of operations of the second embodiment shown in FIG. 7.
Figure 9:
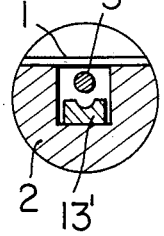
FIG. 9 is an enlarged fragmentary view of the portion of FIG. 8A indicated by circle III.

A second embodiment of the present invention is shown in FIGS. 7 to 9, wherein a pair of belts 3 and a pair of longitudinal members 13' of the elevator are respectively received in a pair of common grooves 6. The construction of the second embodiment and its operation with respect to the wafer 1 are otherwise similar to the first embodiment, with the following exceptions. After the heat treatment on the hot plate 2, which is depicted in FIG. 8A, the elevator, with the belts 3 resting thereon, is raised as shown in FIG. 8B. Then the belts 3 are further raised and separate from the longitudinal members 13' as illustrated in FIG. 8C. The wafer 1, now held on the belts 3, is transferred to the discharge conveyor 11 in the aforementioned manner.

An advantage of the second embodiment is that a single pneumatic or hydraulic cylinder, such as cylinder 14 or 15 shown in FIG. 4, is enough. As shown in FIG. 9, the belts 3 are normally separated from the longitudinal members 13' of the elevator when disposed in the grooves 6. The two frameworks 16 and 18 shown in FIG. 4 can be combined into a single framework, which simplifies the entire structure.

Figure 10:
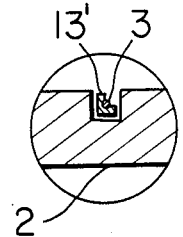
FIG. 10 is a fragmentary view showing another example of the portion of FIG. 8A indicated by circle III.

While the wafer 1 undergoes a desired heat treatment, the belts 3 are maintained at a suspended state as shown in FIG. 9. When the heat treatment is finished, both the belts 3 and the longitudinal member 13' are raised together by a single cylinder (not shown). If the wafer 1 should stick to the hot plate 2 beyond the tension of the belts 3, the longitudinal members 13' will assist the belts from below, as shown in FIG. 8B, thereby forcing the wafer 1 upward off of the hot plate 2. After the wafer 1 is lifted above the top surface of the hot plate 2, it is placed on the belts 3, and fed to the discharge conveyor 11. The tension of the belts 3 can be adjusted. The top edge of each longitudinal member 13' is preferably grooved as shown in FIG. 9 or shaped like the letter "L", as shown in FIG. 10, or may be shaped in any other form which helps secure the belts 3 thereon.

Figure 11:
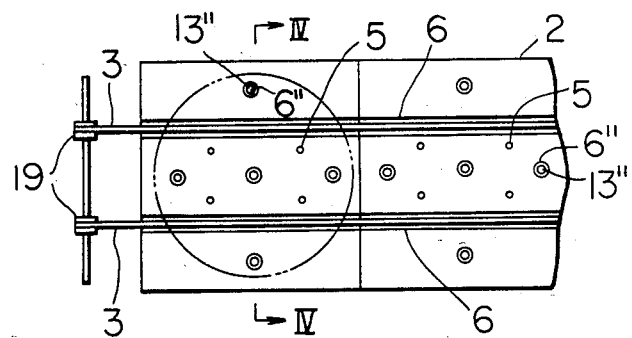
FIG. 11 is a plan view of a third embodiment of the invention.
Figure 12:
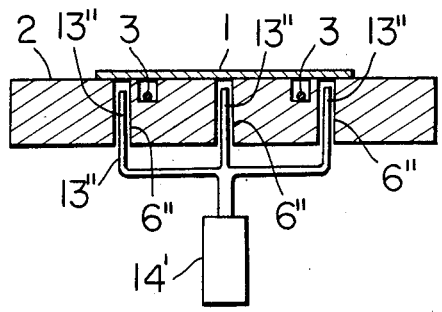
FIG. 12 is a cross-sectional view taken along the line IV—IV in FIG. 11.

Referring to FIGS. 11 and 12, where a third embodiment of the invention is shown, the hot plate 2 is provided with a plurality of apertures 6" in the upper face thereof, in which elevating pins 13" are movably accommodated. The belts 3 are likewise accommodated in the grooves 6.

While the heat treatment is in operation, the belts 3 and the elevating pins 13" sink into the grooves 6 and into the apertures 6", respectively, as shown in FIG. 12. When the heat treatment is finished, the elevating pins 13" are raised by a pneumatic cylinder 14', thereby lifting the wafer 1 so as to separate it from the hot plate 2. Simultaneously or immediately afterward the belts 3 are raised, thereby separating the wafer 1 from the elevating pins 13". The wafer 1 is then conveyed to the next process. As shown in FIG. 12, the elevating pins 13" are coupled to a common support, which is driven by the single cylinder 14'.

In the foregoing description, heat treatment is assumed to be provided by the use of a hot plate, but the invention can be applied to a cooling plate for cooling treatment or to other devices. In addition, the invention can be applied to sheet- or panel-like material other than wafers.

As is evident from the foregoing description, various advantages may be obtained through use of the present invention, such as the following:

(a) Since the wafer is conveyed to the next process immediately after it is lifted away from the hot plate at the completion of heat treatment, the total feeding speed of the wafers is increased, while minimizing possible operational errors or dislocations of the wafers, which often occur in the conventional belt conveyor systems. This greatly contributes to the promotion of automatic operation;

(b) Since, unlike the conventional link-motion conveyor system which requires a relatively large space around the hot plate to take wafers in and out, no large space is required to install the apparatus, the size of the apparatus may be increased; and (c) Since the pneumatic suction system is adopted, the problems associated with dust dispersed by blown air, which happen in a conventional air-blow system, are avoided.

It should be understood that the detailed description and specific embodiments described above are given by way of illustration only, since various changes and modifications within the spirit and scope of the invention will become apparent to those skilled in the art from this detailed description.

We claim:

1. An apparatus for feeding wafers or the like along a path to a processing section, and moving the same therefrom to a succeeding process, said apparatus comprising:

belt conveyor means drivable along the feed path of the wafers or the like and having a top surface that is horizontally maintained;

means for raising and lowering said belt conveyor means, thereby allowing the wafers or the like thereon to come into or out of position on the processing section;

at least one processing plate associated with the processing section to which at least a suction tube is connected, said tube being adapted to allow a vacuum to pass therethrough so as to hold the wafer on said processing plate, said processing plate being provided with at least a first pair of parallel grooves on its upper surface adapted to receive the belt conveyor means when the wafer or the like is placed on the processing plate; and elevator means, substantially cooperating with said belt conveyor means, for raising the wafer or the like to detach said wafer from the processing plate, said elevator means being arranged such that it protrudes and withdraws with respect to the upper surface of the processing plate.

2. The apparatus set forth in claim 1, wherein the processing plate includes a heater embedded therein.

3. The apparatus set forth in claim 1, wherein the processing plate includes a cooling device embedded therein.

4. The apparatus set forth in claim 1, wherein two or more processing plates are arranged in series with respect to the feed path of the wafers or the like.

5. The apparatus set forth in claims 1, 2, 3 or 4, wherein:

said processing plate includes at least a second pair of grooves on its upper surface arranged parallel to the first pair of grooves, and said elevator means includes at least a pair of vertically movable supporting members movably accommodated in the second pir of grooves, and at least one driving means connected to said supporting members for moving said supporting members up and down with respect to the second pair of grooves.

6. The apparatus set forth in claims 1, 2, 3 or 4, wherein:

both the belt conveyor means and the elevator means are commonly accommodated in said first pair of grooves and are coupled to a common driving means, and the elevator means includes means for assisting the belt conveyor means from below, so as to force the wafer or the like upward off of the processing plate.

7. An apparatus set forth in any of claims 1, 2, 3 or 4, wherein:

said processing plate has a plurality of apertures in the upper surface thereof, and the elevator means includes pushing pins for lifting the wafer upwardly off of the processing plate, and driving means for raising and lowering said pushing pins, said pushing pins being movably accommodated in said apertures of the processing plate, and being adapted to intermittently protrude from the upper surface of the processing plate.

* * * * *